US006843927B2

(12) United States Patent
Naser-Ghodsi

(10) Patent No.: US 6,843,927 B2
(45) Date of Patent: Jan. 18, 2005

(54) METHOD AND APPARATUS FOR ENDPOINT DETECTION IN ELECTRON BEAM ASSISTED ETCHING

(75) Inventor: Mehran Naser-Ghodsi, Hamilton, MA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 92 days.

(21) Appl. No.: 10/420,429

(22) Filed: Apr. 21, 2003

(65) Prior Publication Data

US 2004/0043621 A1 Mar. 4, 2004

Related U.S. Application Data

(63) Continuation-in-part of application No. 10/272,467, filed on Oct. 8, 2002.
(60) Provisional application No. 60/427,840, filed on Nov. 19, 2002, provisional application No. 60/406,939, filed on Aug. 27, 2002, and provisional application No. 60/406,999, filed on Aug. 27, 2002.

(51) Int. Cl.[7] .............................................. H01L 21/302
(52) U.S. Cl. .............................. 216/84; 216/85; 216/86; 438/9; 438/14; 156/345.23; 156/345.28; 156/345.4
(58) Field of Search ................................ 438/16, 17, 9, 438/10, 14; 216/85, 86, 84; 156/345.4, 345.39, 345.25, 345.28

(56) References Cited

U.S. PATENT DOCUMENTS 5,055,696 A * 10/1991 Haraichi et al. ......... 250/492.2
5,273,935 A * 12/1993 Morimoto et al. ...... 204/192.33
6,225,627 B1 * 5/2001 Koyama ...................... 250/309
6,677,586 B1 * 1/2004 Nasser-Ghodsi et al. ... 250/310

FOREIGN PATENT DOCUMENTS

JP          60-200529        * 10/1985

OTHER PUBLICATIONS

"End–point detection using absorbed current, secondary electron, and secondary ion signals during milling of multilayer structures by focused ion beam", Journal of Vacuum Science and Technology B, Mar. 1993', vol. 11, No. 2, pp. 263–267, ☐☐☐☐Davies et. al.*

* cited by examiner

Primary Examiner—George A. Goudreau
(74) Attorney, Agent, or Firm—Beyer Weaver & Thomas, LLP

(57) ABSTRACT

Techniques for detecting endpoints during semiconductor dry-etching processes are described. The dry-etching process of the present invention involves using a combination of a reactive material and a charged particle beam, such as an electron beam. In another embodiment, a photon beam is used to facilitate the etching process. The endpoint detection techniques involve monitoring the emission levels of secondary electrons and backscatter electrons together with the current within the sample. Depending upon the weight given to each of these parameters, an endpoint is identified when the values of these parameters change more than a certain percentage, relative to an initial value for these values.

35 Claims, 5 Drawing Sheets

METHOD AND APPARATUS FOR ENDPOINT DETECTION IN ELECTRON BEAM ASSISTED ETCHING

CROSS-REFERENCE TO RELATED APPLICATIONS

This application claims priority of U.S. provisional patent application No. 60/427,840, filed Nov. 19, 2002, entitled "METHOD AND APPARATUS FOR ENDPOINT DETECTION IN ELECTRON BEAM ASSISTED ETCHING," which is hereby incorporated by reference.

This application is also a continuation-in-part of U.S. patent application Ser. No. 10/272,467, filed Oct. 8, 2002, entitled "METHODS AND APPARATUS FOR ELECTRON BEAM INSPECTION OF SAMPLES," which claims priority under U.S.C. 119(e) from U.S. Provisional Application No. 60/406,939 and U.S. Provisional Application No. 60/406,999 both filed on Aug. 27, 2002 and entitled, "METHODS AND APPARATUS FOR ELECTRON BEAM INSPECTION OF SAMPLES" by Mehran Nasser-Ghodsi and Michael Cull, the entireties of which are incorporated by reference for all purposes.

This application is also related to U.S. patent application Ser. No. 10/272,468, filed Oct. 10, 2002 entitled "METHODS AND APPARATUS FOR ELECTRON BEAM INSPECTION OF SAMPLES" by Mehran Nasser-Ghodsi and Michael Cull, the entirety of which is incorporated by reference for all purposes.

This application is also related to U.S. patent application Ser. No. 10/281,425, filed Oct. 24, 2002, and entitled "METHODS AND APPARATUS FOR ELECTRON BEAM ASSISTED ETCHING AT LOW TEMPERATURES," the content of which is hereby incorporated by reference.

FIELD OF THE INVENTION

The present invention relates generally to semiconductor manufacturing processes, and more specifically to etching processes.

BACKGROUND OF THE INVENTION

Inspection techniques for semiconductor manufacturing processes include etching techniques such as reactive ion etching, focus ion beam etching, and chemical etching. Etching of semiconductor wafer specimens has traditionally been used for masked film/layer removal. However, etching can also be used for defect analysis and metrology by inspecting the stacks of materials that make up a wafer. In reactive ion etching, the ions react with the surface material of the sample to form an evaporative material that thereby evaporates from the sample. An obstacle encountered with this technique presents itself when dry etching some materials such as copper. When the copper is bombarded with Cl-containing reactive gases, a copper chloride material, $CuCl_x$, is formed over the surface of the copper. This chloride material fails to evaporate well at room temperatures. Accordingly, the sample needs to be heated to temperatures that are significantly higher than room temperature to facilitate evaporation of the $CuCl_x$ material. For example, the substrate of sample must be heated to above 200° C. in order to etch Cu films. In many cases, a conventional dry etch process prevents the sample from being used in production since the high temperatures tend to damage the sample.

Another obstacle encountered with the etching process involves determining the endpoint for each etching process. An endpoint refers to the point at which an etching process is terminated because a specific metal, oxide, or photo resist has been fully removed.

Consequently, improved techniques and systems for etching materials, such as Cu, to produce fine patterns at low temperature are needed. Additionally, techniques and systems for etching samples which do not destroy the sample are needed. Preferably, a dry etching mechanism that works at room temperatures for materials which cannot be conventionally dry etched at room temperatures is needed. Also, techniques for accurately determining the endpoint of such etching techniques would be desirable.

BRIEF SUMMARY OF THE INVENTION

The present invention is directed to techniques for detecting endpoints during semiconductor dry-etching processes. The dry-etching process of the present invention involves using a combination of a reactive material and a charged particle beam, such as an electron beam. In another embodiment, a photon beam is used to facilitate the etching process. The endpoint detection techniques involve monitoring at least the emission levels of secondary electrons, backscatter electrons, substrate x-ray emissions, residual gas emissions form the substrate, and the current within the sample. Depending upon the weight given to each of these parameters, an endpoint is identified when the values of these parameters change more than a certain percentage, relative to an initial value for these values.

As a method, one embodiment of the present invention includes at least scanning a first area on a sample with a charged particle beam such that secondary electrons and backscatter electrons emanate from the first area on the sample, introducing a reactive substance onto the sample, using the combination of the charged particle beam and the reactive substance to etch the sample, monitoring the level of secondary electron and backscatter electron emissions, monitoring the amount of current within sample, determining an endpoint when at least one of the measured levels of backscatter electrons, secondary electrons, and current change by a certain percentage. In an alternative embodiment, the current level of the charged particle beam is monitored and the measurement is used to normalize the secondary electron and backscatter electron emission measurements.

As an apparatus, one embodiment of the present invention includes at least a reactive agent injector operable to introduce a reactive substance onto the sample, a charged particle beam generator operable to scan the first area with a charged particle beam, the charged particle beam interacting with the reactive substance such that the reactive substance and the charged particle beam serve to etch a material of the sample located within the scanned first area, a secondary electron detector, a backscatter electron detector, a current meter, and an endpoint detection module. The endpoint detection module determines an endpoint for the etching of the material of the sample by monitoring the level of secondary and backscatter emissions and the amount of measured current.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to techniques for detecting endpoints during semiconductor dry-etching processes. An endpoint refers to a point at which an etch process has reached the boundary (or end) of a layer and therefore the point in time at which the etch process should be terminated. The dry-etching process of the present invention involves using a combination of a reactive material and a an electron beam. In another embodiment, a photon beam is used, in conjunction with the electron beam, to facilitate the etching process. The endpoint detection techniques involve monitoring the emission levels of secondary electrons, backscatter electrons, residual gasses, x-ray emissions (when an area of the substrate with uniform material composition is being etched), and the current within the sample. Depending upon the weight given to each of these parameters, an endpoint is identified when the values of these parameters change more than a certain percentage relative to initial values.

The dry-etching techniques of the present invention are useful for various purposes, such as nondestructive investigation of defective features on a semiconductor wafer. In one embodiment, the test sample is a wafer having a plurality of integrated circuits. Various techniques are applied in conjunction with an electron beam (and a photon beam) to scan and etch away material, cross-section defects, remove deposits at a scan target, and determine when enough material has been etched or removed.

Several embodiments of the present invention are described in the context of exemplary multilevel integrated circuit structures, including semiconductor structures and overlying metallization or other interconnects, using various levels of conductors that are separated from each other and the substrate by dielectric layers. However, structures formed using other methods of semiconductor fabrication also fall within the scope of the present invention. The techniques of the present invention apply to all surfaces with and without specific layers.

Figure 1:
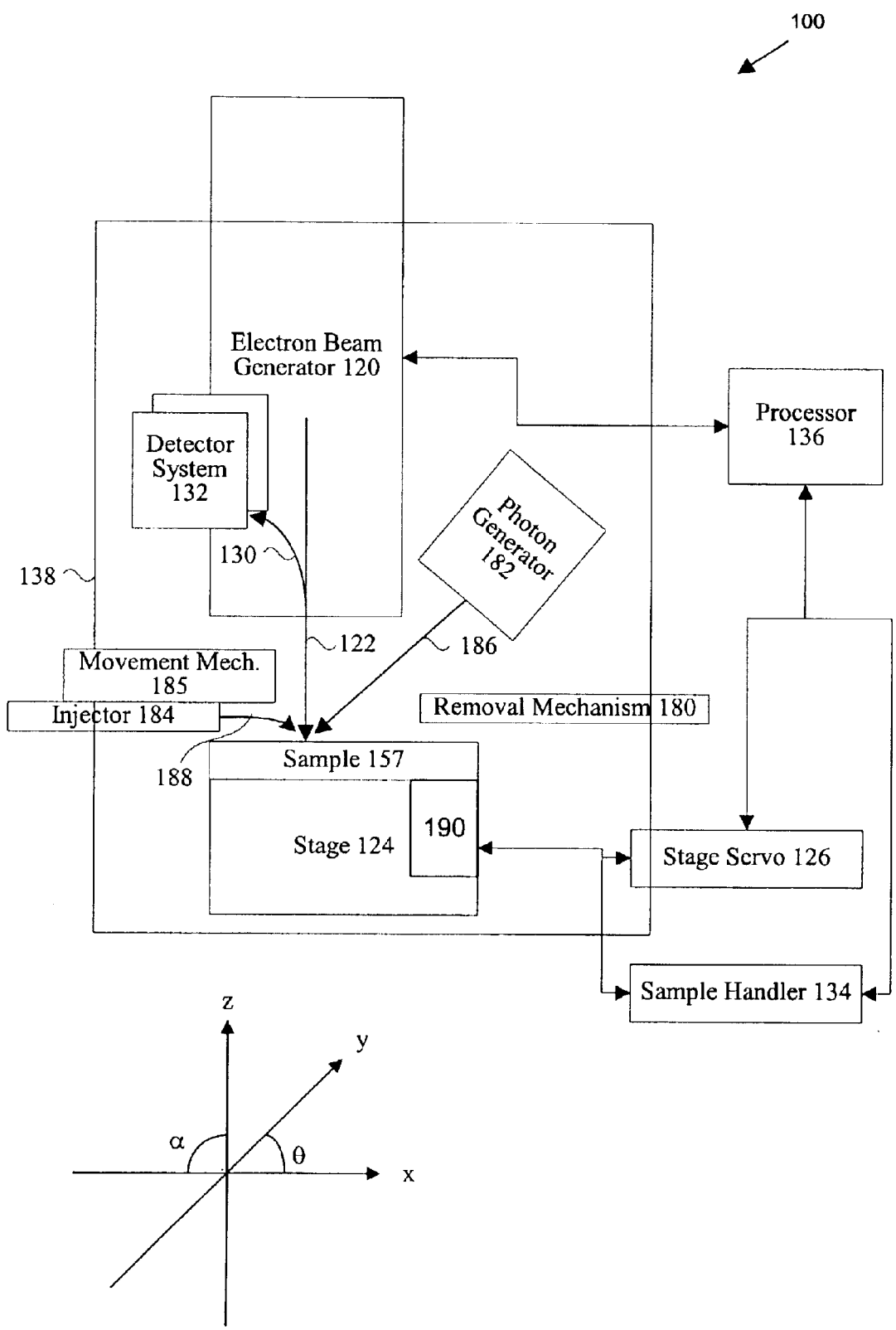
FIG. 1 is a diagrammatic representation of an electron and photon beam assisted etching system in accordance with one embodiment of the present invention.

FIG. 1 is a diagrammatic representation of an electron and photon beam assisted etching system 100 in accordance with one embodiment of the present invention. As shown, the etching system 100 includes an electron beam generator 120 for directing an electron beam 122 towards a spot or scan area on a sample 157, a reactive agent injector 184 for introducing a reactive gas 188 onto or near the same spot or scan area on the sample 157, and a photon beam generator 182 for directing a photon beam 186 towards the same spot or scan area on the sample 157. As described further below, the electron beam generator 120, reactive agent injector 184, and photon beam generator 182 work together to etch a material from the sample 157. In alternative embodiments, etching of a material can be performed using the combination of electron beam generator 120 and reactive agent injector 184. In these alternative embodiments, the photon beam generator 182 is not required.

According to various embodiments, sample 157 is secured automatically beneath the electron beam generator 120. In the illustrated embodiment, the sample handler 134 is operable to automatically orient the sample on stage 124. In one embodiment, the stage 124 is configured to have six degrees of freedom including movement and rotation along the x-axis, y-axis, and z-axis. In one embodiment, the stage 124 is aligned relative to the electron beam generator 120 so that the x-directional motion of the stage corresponds to the axis determined by the size of a target to be etched. For example, the sample 157 can be aligned so that the x-directional movement of the stage corresponds to the length of a target as viewed from the top of the sample. Furthermore, the sample can be tilted relative to the electron beam 122 along the axis determined by the length of the target. Similarly, the sample 157 can also be aligned so that the x-directional movement of stage corresponds to the size of a target. The sample can be tilted relative to the electron beam 122 along the axis determined by the size of the target.

In one example, the stage lies on the x-y plane and the stage is tilted by varying the angle $\alpha$ as shown in FIG. 1. It should be noted that tilting the sample relative to the electron beam generator 120 can involve tilting the stage, moving the column, deflecting the beam with a lens, etc. It should also be noted that tilting the stage may involve varying the angle $\alpha$ as well as rotating the stage along angle $\theta$. Tilting the sample is one way of allowing scanning from different directions. Where the electron beam generator 120 produces an electron beam 122, the sample can be aligned so that electrons can impinge a scan target from a wide variety of different angles, e.g., to scan within a high aspect ratio via or trench. Alternatively, the electron beam can be deflected as it passes through the electron beam column of a scanning electron microscope so that the beam impinges the sample at a desired incident angle.

Fine alignment of the sample can be achieved automatically or with the assistance of a system operator through processor 136. The position and movement of stage 124 during the analysis of sample 157 can be controlled by stage servo 126. While the stage 124 is moving in the x-direction, the electron beam 122 can be repeatedly deflected back and forth in the y-direction. According to various embodiments, the electron beam 122 can move back and forth in a wide range of frequencies based on the specific chemistries used. Alternatively, a relatively wide electron beam may be utilized to etch a particular area of the sample without rastering the beam relative to the sample.

The reactive agent injector 184 may take any suitable form for injecting a reactive agent onto the sample at a spot onto which an electron beam (and a photon beam) impinge.

In example implementations, the reactive agent injector 184 is in the form of needle or fine nozzle coupled with a reservoir or an injection conduit or tube. Since the chamber is kept at a vacuum pressure (e.g., with a vacuum pump), a reactive substance flows from the reservoir, into a first end of the injection tube, and escapes out of a second end of the injection tube onto the sample. In other example implementations, the reactive agent injector 184 is formed from a mixing of various gases coming from different gas transportation conduits. The reactive agent injector is positioned so that it can effectively inject the reactive substance onto a selected spot or target area of the sample. In one embodiment, the reactive agent injector 184 is arranged within a distance that is less than about 2 mm from the sample 157 to introduce reactive gas 188 onto the sample surface. A movement mechanism 185 may be utilized to movably position the injector 184 near the sample 157. The movement mechanism may take any suitable form for moving the injector 184 towards and away from the sample 157. For example, the movement mechanisms 185 may include an actuator and translational motor in the form of, among others, a screw drive and stepper motor, linear drive with feedback position, or band actuator and stepper motor. The movement mechanism 185 may also position the injector 184 away from the sample when the injector 184 is not in use.

With the presence of reactive substance and the charged particle beam, the charged particles 122 can etch away the material at the scan target. The reactive gas 188 may be any suitable gas or fluid which acts to etch away a particular target material with the assistance of a charged particle beam. For instance, the reactive agent or gas 188 may be selected to have a high affinity for the electron beam to thereby disassociate into highly reactive elemental gases to interact with the sample. In alternative embodiments, the highly reactive elemental gases proceed to generate chorine/fluorine based "salts" which in turn react with a photon beam. In various semiconductor applications, the reactive gas may be a chlorine based gas, a fluorine based gas, a bromide based gas, a halogen based gas, a halogen-containing gas or a mixture of halogen-containing gas and other gases. By way of examples, the reactive gas is a halogen-containing gas such as $CCl_4$, $CHCl_3$, $CH_2Cl_2$, $CH_3Cl$. The halogen-containing compound may be mixed with other gases or materials, such as $H_2O$, $O_2$, $NH_3$. etc. The interaction leaves one or more residual components. In one embodiment, the reactive gas is $CF_4$ contains $CCl_4$, which breaks up into atoms, radicals and ions carbon and fluorine to interact with the sample to produce a chemical (or chemicals) that has an appropriate pressure for evacuation by a pumping system.

In sum, the reactive substance (e.g., gas) together with the electron and photon beam interact with a material on the sample to produce one or more residual components. According to various embodiments, the residual components, which also include the injected reactive substance, are removed by using a residual component removal mechanism 180. In one embodiment, the residual component removal mechanism 180 includes a conduit with a first end within the chamber and a second end outside the chamber and a pump coupled to the conduit for evacuating residual components from the chamber through the conduit into a reservoir, for example.

Photon beam generator 182 generates a photon beam 122 for facilitating the interaction between the electron beam 122, reactive gas 188, and surface material of the sample 157 to thereby more quickly etch away the surface material, as compared to a charged particle beam etching process that does not use a photon beam generator. In general, the photon beam generator 182 may induce a chemical and/or physical effect with respect to the interaction between the electron beam 122, reactive gas 188, and surface material of sample 157. The photon beam 186 can generate surface heating and induce photochemical reaction on the surface of target area. The photon beam generator 182 may generate any suitable type of light beam to assist the charged particle induced etching. The type of light used depends on the type of material to be etched, the charged particle beam properties used, and the type of reactive agents being introduced. A laser beam having a wavelength in the infrared region (for example, around 1064 nm) or the region between 250 and 550 nm works well in the application of etching copper materials. In other applications, lasers in the range of 10 um wavelength are utilized. By way of examples, the photon beam generator may be in the form of a laser source, such as a 308 nm laser, or a broadband light source, such as an infrared (IR) lamp.

The system 100 of FIG. 1 allows etching of materials at room temperature that cannot otherwise be etched at room temperatures using conventional etching techniques, such as reactive ion etching. For example, one may use the system 100 of FIG. 1 to effectively dry etch copper at ambient temperatures below 50° C. In other words, the sample does not have to be heated to temperatures over 200° C. to thereby induce etching as in conventional etching systems. Of course, localized and material specific temperature may rise above 200° C., while the system ambient temperature remains below 50° C. Since only the target area of sample is being etched with a reactive substance, a charged particle beam, and a photon beam at room temperature and since there is no Ga contamination which is present in focused ion beam cross-sectioning, the other areas of sample is not destroyed during the etching process and may be used in production.

In order to identify the endpoint for an etching process, system 100 includes a set of detectors 132 aligned alongside the electron beam generator 120 and a current meter 190. Detectors 132 detect secondary and backscatter electrons 130 emitted from the sample in response to the incident beam 122. Detectors 132 can be configured to detect x-ray emissions from the sample. Alternatively, additional detectors can be added to detect x-ray emissions.

Detectors 132 used to image secondary electrons typically function by drawing electrons to a collector screen by −100 to +1100 volt bias (relative to the sample). The electrons are then accelerated to a scintillator by the scintillator voltage. Once they strike the scintillator the electrons are converted to photons, where the resulting photons enter a light pipe to the side window photo-multiplier. The photo-multiplier then amplifies the light. Secondary and backscatter electron emmissivity depends on the characteristics of the material being scanned. These characteristics include the secondary and backscatter yield of the substrate as a function of the energy of the primary beam. The resulting secondary and backscatter yield result in varying degrees of image intensity when scanning the substrate with an electron beam.

A current meter 190 is connected to sample 157 in order to measure the current flowing through sample 157. Typically, current meter 190 will be mounted within stage 124. In alternative embodiments current meter 190 can be separate from stage 124. The current can be measured in specific areas of sample 157 depending upon the location of interest. For example, in determining the endpoint of an etching process, the current flowing through the etched area would be the area of interest because the amount of current flowing through the area of interest depends upon the material characteristics in that area of interest. Such characteristics include the type of material, the thickness of the material layer, and the length and width of the area of interest.

In another embodiment of this technique, the x-ray emmisivity of the sample is monitored by measuring x-ray counts. In a multi-layered sample the x-ray peak and count of the sample is directly proportional to beam energy and the depth of the sample being etched. As an etching process removes the thickness of a layer, while using a constant electron energy, the resulting x-ray count remains constant as long as the depth of e-beam penetration is smaller than the thickness of material being removed. As the depth of the material to be etched becomes less than the e-beam penetration depth, then the e-beam will illuminate the underlying layer. The resulting spectrum will begin to provide greater x-ray count from the underlying layer, while the x-ray count in the top layer begins to decrease. Differential x-ray count of the primary layer (to be etched) and the underlying layer (end point layer) enables the system to detect and monitor incremental increases in x-ray counts of the underlying layer versus decrimental count of the etch layer. Note that measurement of X-ray emissions is typically more accurate when the area of the substrate being etched has a uniform material composition.

In another embodiment, the residual gasses emanating from the sample are monitored as an indicator of etched material composition.

By measuring each of the secondary electron emissions, the backscatter emissions, x-ray emissions, residual gas analysis, and the current within the sample 157, calculations can be made to chart the progress of an etching process. By following the progress, the endpoint of an etching process can be determined. These calculations can be performed by hand or calculated by a computer processor such as processor 136. Processor 136 can also monitor the current level of the electron beam generated by electron beam generator 120. This is important since the level of secondary and backscatter electron emissions is proportional to the strength of the electron beam current. By normalizing the measured level of electron emissions relative to the electron beam current, more meaningful information can be generated. In this way, a change in emission levels can be identified as being caused by a change in the inspected sample. Without normalizing the electron emission level readings, an inspection operator would not be able to determine if a change in electron emission levels was caused by a change in the material being inspected or a change in the intensity of the electron beam.

The electron beam generator 120 and detector 132 as well as other elements such as the photon beam generator 182, the residual component removal mechanism 180, and the reactive agent injector 184 can be controlled using a variety of processors, storage elements, and input and output devices (e.g., processor 136).

As shown, the sample 157, stage 124, electron beam generator 120, detector 132, current meter 190, and photon generator 182 are enclosed within a vacuum chamber 138. The injector 184 and removal mechanism 180 are shown as being partially within and partially outside the vacuum chamber 138. The photon generator 182 may alternatively be located completely or partially outside the chamber 138 wherein a light carrier, such as a fiber optical cable, directs the photon beam 186 into the chamber 138 and onto the sample 157. The injector 184 and removal mechanism 180 may alternatively be located completely within the chamber 138. For example, the injector mechanism may include a conduit and reservoir located completely within the chamber 138.

One skilled in the art would understand that variations to the system 100 shown in FIG. 1 fall within the scope of the present invention. For example, FIG. 1 shows the utilization of an electron beam with a continuously moving stage. However, any suitable type of charged particle beam may be used. As an alternative to moving the stage with respect to the electron beam, the electron beam may be moved by deflecting the field of view with an electromagnetic lens. Alternatively, the electron beam column can be moved with respect to the stage.

Figure 2:
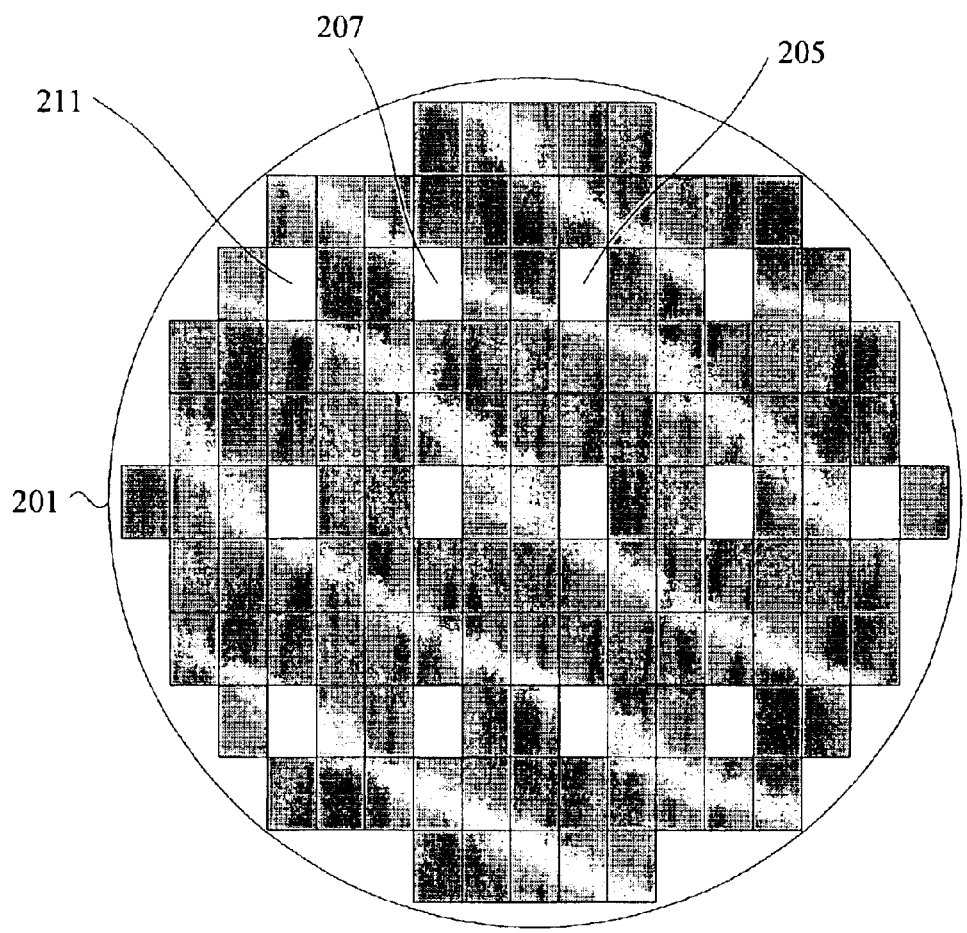
FIG. 2 is a diagrammatic representation of a wafer that may be a sample under test.

FIG. 2 is a diagrammatic representation of a wafer that may be a sample under test. A wafer 201 comprises a plurality of die 205, 207, and 211. According to various embodiments, a sample is etched after a metallization or thin film layer is deposited onto a wafer. The side of the wafer where the metallization process is performed is herein referred to as the top surface of the wafer.

Figure 3:
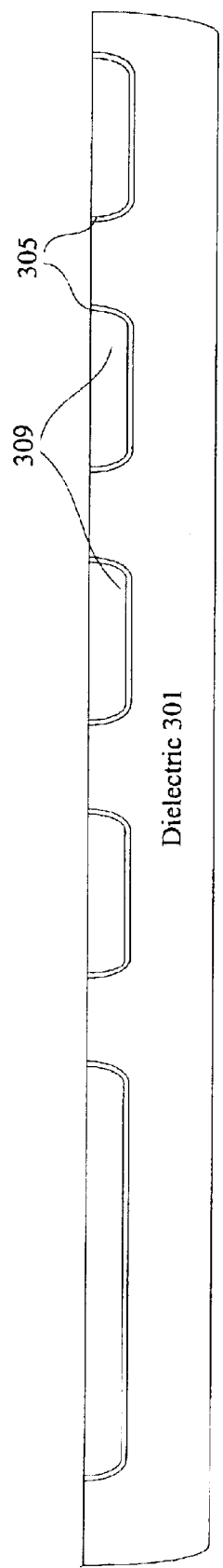
FIG. 3 is a diagrammatic representation of a cross-section of a test sample.

FIG. 3 is a diagrammatic representation of a cross-section of a test sample. The techniques of the present invention can be used to etch any suitable layer of the sample for various purposes. In one example, a resist layer can be etched in order to examine the materials beneath the resist layer. In another example, a substrate is etched to inspect a structures underneath the substrate. In still another example, the metallization or thin film layer 309 on top of a barrier layer 305 is etched down to the underlying barrier layer. According to various embodiments, the thin film layer 309 comprises a material such as copper (Cu) or aluminum (Al) and the barrier layer comprises a material such as tantalum (Ta) or tantalum nitride (TaN). The electron beam and photon beam assisted etching system and techniques of the present invention are especially useful for materials which cannot be affectively dry etched at room temperature, such as Cu.

Figure 4:
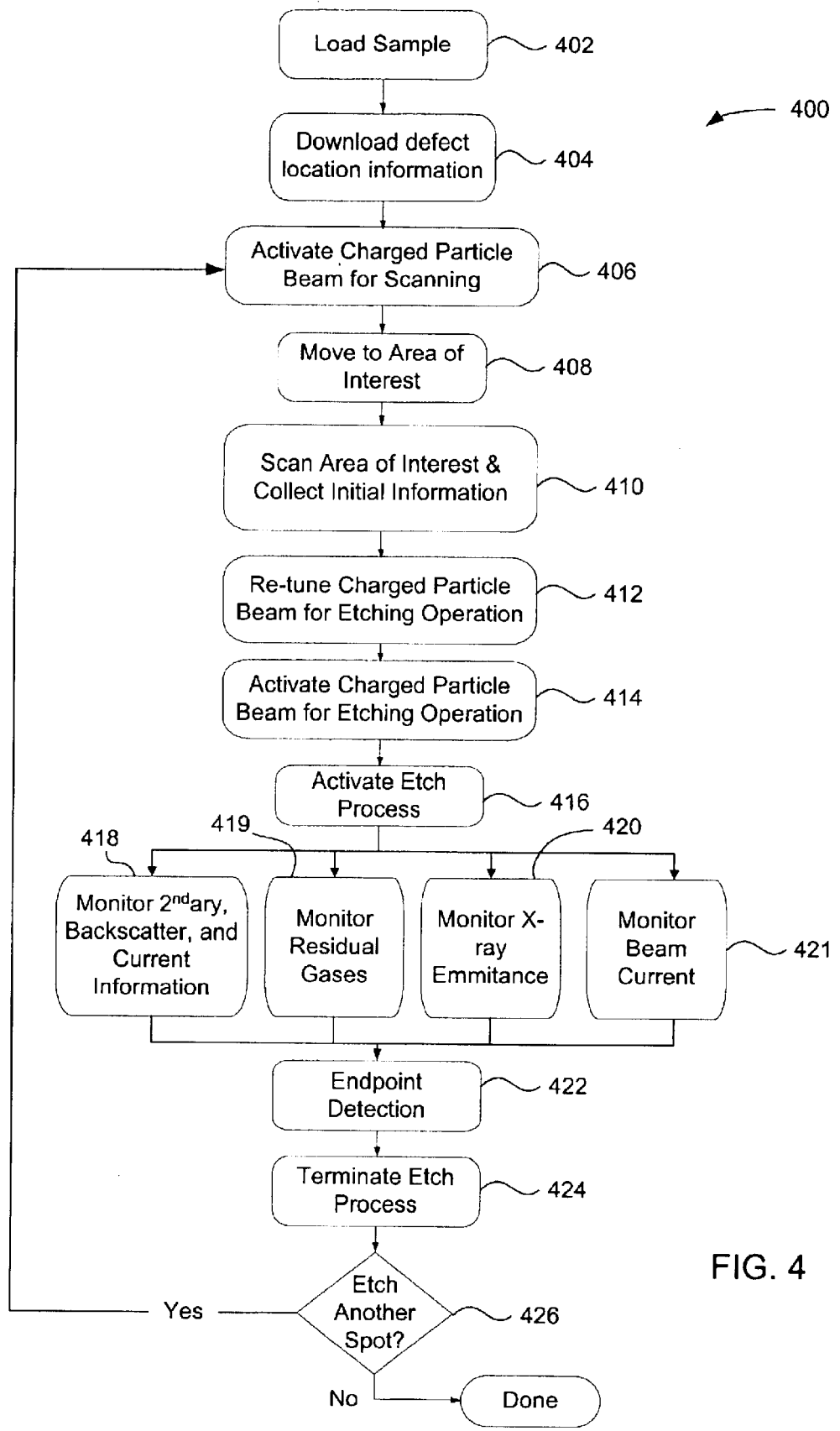
FIG. 4 is a flow chart illustrating a procedure for etching a surface material from a sample and determining an etching endpoint, according to one embodiment of the present invention.

Any suitable etching technique may be implemented to attain a charged particle (and photon beam) assisted etch process. FIG. 4 is a flow chart illustrating a procedure 400 for etching a surface material from a sample with an electron beam and a reactive agent and determining an etching endpoint, according to one embodiment of the present invention. Initially, a sample is placed within the vacuum chamber (e.g., 138) of an etching system in operation 402. In operation 404, information that allows the etching system to locate specific defects is loaded into the system. Specifically, this information can be loaded into processor 136. In the scenario of inspecting a semiconductor wafer, this information can include layer recipe information. Layer recipe information details information regarding the structural layout of the different layers that make up a semiconductor wafer. Specifically, this can include the thickness of each layer, the location of each well and via and the location of the different materials within each layer (e.g., doped areas). This information allows an inspection operator or software module to appropriately adjust etching system settings for the inspection and etching processes. For example, the electron beam current can be set to appropriate levels to avoid excessive or inadequate etching speeds. The loaded information also can optionally include defect and feature information that allows the inspection and etching system to locate each of the defects or features that need to be inspected. Some embodiments this information is generated by a separate etching system such as an optical etching system.

In operation 406, the charged particle beam is activated so that it can be used for scanning across the sample. At this point in the process flow, the charged particle beam may have to be focused and tuned for the scanning operation. The charged particle beam is typically focused so that it hits the sample at a focused point. Then in operation 408, the charged particle beam is moved to the area of interest. This is performed by adjusting the charged particle beam generator so that the charged particle beam can be directed at the area of interest. This can involve, for example, adjusting magnets that aid in directing the charged particle beam. The area of interest can be a defect that needs to be inspected (e.g., by cross-sectioning), an integrated circuit feature that requires inspection, or a general area that is of interest. Alternatively, the sample may need to be etched uniformly. In this case, spots may be sequentially selected on the sample so that the entire surface area of the sample is sequentially etched.

Next in operation 410, the charged particle beam is used to scan the area of interest. Scanning of the area of interest allows the etching system to collect an image of the area of interest and to collect initial information about the layers within the sample. Some of the information collected is for the purpose of monitoring when an etching endpoint is reached. At this stage of the process, etching has not yet begun and therefore initial measurements of some or all of the following can be taken: the secondary electron emission level, the backscatter electron emission level, the x-ray count, the residual gas composition, and the current passing through the sample are taken.

The etching process causes the removal of the material on the top layer in order to expose the underlying material layer. As the etching progresses, the measurements of the various factors may change when the charged particle beam penetrates materials having different compositions. For example the current within the sample changes because the material composition of the sample and the dimensions of the area of interest changes as material is removed. Through the understanding of the relationships between the secondary electron emission level, the backscatter electron emission level, the x-ray emissions, the residual gas composition, and the current measurements with respect to the layers of materials within the sample, it is possible to determine how far an etching process has progressed. For example, the current measurement technique can be used to determine the end of an etch process for a metal layer over an isolation layer. Therefore, tracking these emission and current levels and monitoring their change in values (relative to initial values) allows an etching operator to determine an etching endpoint.

Changes in each of the emission levels and the current will depend upon the types and dimensions of the material layers in the sample. Therefore, an inspection operator can make calculations appropriate for or a software module can be programmed to provide a specific weighting to each of the emission levels and the current measurement so that measurements that are most sensitive and accurate for a particular etching process can be obtained. For instance, when a top conductive layer is to be etched away to expose another conductive layer that is underlying, the current measurements can be given a small or negligible weighting since the change in current will not be large. In this case, the weighting will be distributed to emphasize the measurements of the secondary and backscatter electron emissions. However, when a top layer of dielectric material is to etched away to expose a metal layer (or vice-versa), then the weighting for the current measurement can be large since the change in current will be significant. It follows that in these cases, the weighting for the secondary and backscatter electron emissions will be smaller.

At this point it is important to begin monitoring the current level of the charged particle beam because the intensity of the charged particle beam is proportional to the level of secondary and backscatter electron emissions. Stronger intensities of a charged particle beam cause higher levels of emissions and vice-versa. Therefore, the measurements of the secondary electron and backscatter electron emissions should be normalized against the intensity level of the charged particle beam. Otherwise, the change in emission level measurements cannot be identified as being caused by a change in the materials being etched or by a change in the intensity of the charged particle beam.

At operation 412 the charged particle beam is retuned for the etching phase where it will be used to interact with a reactive substance. Typically, the charged particle beam is retuned to produce a higher intensity beam since the beam should have sufficient energy to cause a reaction with the reactive substance. In an embodiment that uses a photon beam to further assist in etching, the photon beam can also be prepared during this operational stage.

At operational block 414 the charged particle beam generator is activated and a charged particle beam is directed at the area of interest for etching. In one embodiment, the charged particle beam (and photon beam) is both configured to move over the target spot in a y direction, while the stage is configured to move the sample and its target spot under the beams in an x direction, or visa versa. This combination of these two movements result in a raster scan pattern. However, any suitable scan pattern may be implemented to etch a spot or area on the sample. At this time, the optional photon beam generator can also be activated to direct and scan a photon beam over the area of interest. In this embodiment, the charged particle beam, such as an electron beam, and a photon beam, such as a laser beam, are both scanned substantially simultaneously over the selected spot. In other words, there is a time period when the two beams are both scanning over the selected spot. In another alternative implementation, the electron beam may be interleaved with the photon beam (e.g., via the processor 136). That is, the sample is exposed to the photon beam while the electron beam is blanked off, and visa versa.

In operation 416 the etching process is activated by injecting the reactive substance over the area of interest. While the charged particle beam scan over the same area of interest, a reactive agent is introduced into the chamber (e.g., 138). A material located within the scanned target spot is then etched by the combination of the reactive agent, the charged particle beam, and the secondary electrons emitted by the substrate. This combination of actors etches the target spot because the charged particle beam and the emitted secondary electrons break up the reactive agent into reactive elements capable of etching the sample. In the embodiment that uses the additional photon beam, the photon beam facilitates the etching process by reacting the with reactive elements to generate localized heating, thereby increasing the vacuum pressure of the resulting chemical structure.

The charged particle beam and photon beams may be configured in any suitable manner that results in an etching of the surface material. In one implementation, operating conditions are selected for the charged particle beam and photon beam generators for a particular surface material on a test sample. In other words, the operating conditions are adjusted so as to etch the particular material to a desired thinness. The operating conditions for a particular material may be determined experimentally with a test sample having a known material or by simulation. In the experimental technique, the operating conditions are set to initial values;

the test sample is etched; the sample is then inspected to determine if the material has been etched to the desired thickness; and the operating conditions are then adjusted accordingly. In the simulation technique, a model is generated of a particular material and operating conditions. The simulation includes incrementally adjusting the operating conditions until a desired simulation thickness is achieved for the model material.

The operating conditions include various system parameters, such as landing energy and intensity of the charged particle beam, a scan pattern or frequency of the charged particle beam, a frequency and power of the photon beam (laser or broadband light source; for laser, it can be continuous or pulse laser; for pulse laser, the duration of pulse and pulse repetition rate may also be optimized), the incident angle of photon beam, a scan pattern of the photon beam, an etch time, the injection rate of reactive substance, the beam spot size of the charged particle and photon beam.

When the etching process begins in operation 416, the operational phases for detecting an etching endpoint are initiated. These operational phases are shown by blocks 418, 419, 420, and 421. Some or all of these operations are utilized depending upon the type of sample being etched. Note that blocks 418, 419, 420, and 421 are performed in parallel. In block 418, the emission levels of secondary and backscatter electrons are monitored and the current level within the sample is measured. In block 419, the composition of the residual gases from the etched material on the sample is monitored. In block 420, the x-ray emittance from the sample is monitored. In block 421, the current level of the charged particle beam is monitored so that normalized values of the secondary and backscatter electron emission levels can be determined. In typical etching systems where the charged particle beam is an electron beam, the current fluctuation can range within +/−20%.

Etching process goals vary depending upon the inspection requirements. In some applications the surface material may have to be etched to a predefined thickness and in other applications the surface material may have to be completely etched away. Therefore, the endpoint detection algorithms will depend upon the goals of the etching process. By monitoring the etching progress, an etching operator or a software module can control the etching process to obtain the desired etch. For example, when a final etch result is near, the etching process can be slowed so to ensure that over etching does not occur.

In block 422, endpoint detection is performed by using algorithms that are tailored for specific samples and etching goals. In one implementation, an algorithm determines an endpoint has been reached when one, two or three of the factors (i.e., electron emissions and current level) have changed in value by a threshold percentage with respect to an initial measurement. For instance, an endpoint can be reached when the level of secondary electron emissions has increased or decreased by a certain percentage. The percentage change in the factors required to signal an endpoint depends upon the materials being etched and the etching goals. For instance, if two material layers emit very different levels of secondary electrons, then a small percentage change in the secondary electron levels would be sufficient to indicate when one material has been etched away to expose the underlying material. If the etching goal is to merely remove a thin layer of the upper material, then an even smaller percentage change in the secondary electron emission level would indicate an endpoint.

In some implementations, a weighting factor can be assigned to each of the secondary electron emission level, backscatter electron emission level, and the current level so that each can be taken into consideration depending upon their relevance for a particular etching process. For instance, a large weighting factor can be assigned to the type of measurements that are more sensitive for a particular application and a smaller weighting factor can be assigned to the type of measurements that are less sensitive. In the case that one or more of the particular measurement types are very insensitive to an etching process, the respective weighting factors can be set to zero. The algorithms used in block 422 can be evaluated by hand or by a computer system.

When the endpoint detection algorithm of block 422 indicates that an endpoint has been reached, the process shifts to block 424 where the etch process is terminated. The etching is stopped by evacuating the reactive agent form the chamber. If a photon beam generator is used, the photon beam is turned off. The charged particle beam may continue to scan across the sample however it may also be turned off.

It is then determined whether another spot needs to be etched in operation 426. If another spot requires etching, the charged particle beam is once again adjusted to perform scanning in block 406. Then the process flow is repeated as explained. When there are no longer any spots that require etching, the etching procedure 400 then ends.

In alternative embodiments of the present invention, additional measurements can be taken and monitored to further improve the accuracy of the endpoint detection procedure. For instance, an x-ray detector can be added to monitor the x-ray emissions from the sample in addition to measuring electron emissions and current levels. The x-ray measurements can be treated as an additional measurement that can be given a weighting factor depending upon the specific etching process. It should be understood that a charged particle beam with higher energy is required to cause x-rays to emanate from a sample.

Specific algorithms can be developed and tailored to specific samples. In particular, the weighting factors for each of the measurements can be determined so that a certain set of weighting factors can be used whenever a specific sample is being inspected. This is particularly useful when inspecting semiconductor wafers because the ability to use a predetermined set of weighting factors saves time in the production and testing procedures.

It should be noted that the present application's reference to a particular singular entity includes plural entities, unless the context clearly dictates otherwise. Here, for example, multiple residual components may remain for evacuation by a pumping system. Any remnant of an interaction between a reactive substance, an electron beam, and a scan target is referred to herein as a residual component. It should also be noted that although the above example has been described in the context of etching relating to a copper material, a variety of materials and layers can be removed using the techniques of the present invention. In one example, a resist layer is removed using a different reactive substance.

Figure 5:
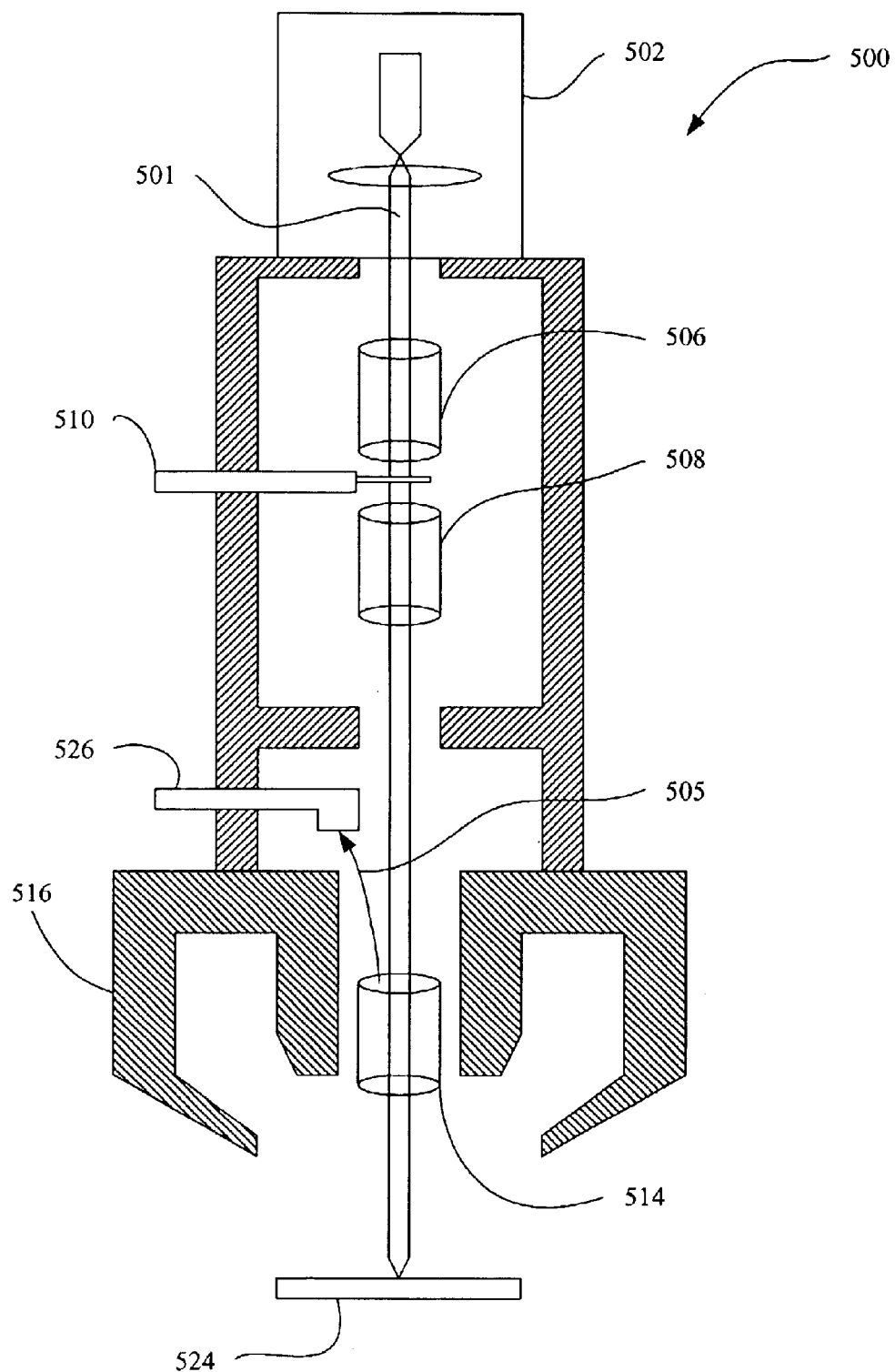
FIG. 5 is a diagrammatic representation of a scanning electron microscope in accordance with one embodiment of the present invention.

The charged particle beam generator 120 of FIG. 1 may take any form which provides charged particle beam assisted etching. In one embodiment, charged particle beam generator 120 forms part of a scanning electron microscope (SEM). FIG. 5 is a diagrammatic representation of a scanning electron microscope (SEM) 500 in accordance with one embodiment of the present invention. As shown, SEM system 500 includes an electron beam generator (502 through 516) that generates and directs an electron beam 501 substantially toward an area of interest on a specimen 524. SEM system 500 may also include a detector 526 arranged to detect charged particles 205 (secondary electrons and/or backscattered electrons) emitted from the sample 524. The SEM may also include an image generator (not shown) for forming an image from the emitted particles.

The electron beam generator may be arranged in any suitable configuration for generating an electron beam that will result in secondary electrons being emitted from the sample 524. In one embodiment, the electron beam generator can include an electron source unit 502, an alignment octupole 506, an electrostatic predeflector 508, a variable aperture 510, a wien filter 514, and a magnetic objective lens 516. The source unit 502 may be implemented in any suitable form for generating and emitting electrons. For example, the source unit 502 may be in the form of a filament that is heated such that electrons within the filament are excited and emitted from the filament. The octupole 506 is configured to align the beam after a particular gun lens voltage is selected. In other words, the beam may have to be moved such that it is realigned with respect to the aperture 510.

The aperture 510 forms a hole through which the beam is directed. The lower quadrupole 508 may be included to compensate for mechanical alignment discrepancies. That is, the lower quadrupole 508 is used to adjust the alignment of the beam with respect to any misaligned through-holes of the SEM through which the beam must travel.

The Wien filter 514 provides a BxE field (e.g., a magnetic field's direction is perpendicular and directed away from a direction of an electric field) that is normal to the electron beam is path. The Wien filter 514 applies an E force on the beam that is opposite to the B force that is applied on the beam. Thus, the Wien filter does not substantially move the beam off axis. However, the Wien filter 514 applies the E force and B force on secondary electrons emitted from the sample in a same direction that is towards the detector 526. Thus, the Wien filter 514 deflects secondary electrons towards the detector 526. The Wien filter 514 and/or octopole 506 and/or quadrapole 508 may be configured to direct the beam across an area of the sample. By setting the X and Y scan voltages, a particular beam pattern may be selected. The deflection system may include a processor that may be also configured to control voltage settings on the electrodes, as well as scan voltages, as a function of incident beam position.

The magnetic objective lens 516 provides a mechanism for fine focusing of the beam on the sample. A plurality of electrostatic lens (not shown) may provide fast focus of the beam onto the sample surface. SEM system 500 may include a support or stage (not shown) for supporting the sample 524.

SEM system 500 may include a detector 526 for generating a detected signal from the detected secondary and/or backscattered electrons, or alternatively X-rays emitted from the sample in response to the electron beam. The detector may take the form of a micro-channel plate, micro-sphere plate, semiconductor diode, a scintillator/photomultiplier (PMT) assembly, an Energy Dispersive System (EDS), or a wavelength dispersive system (WDS) detector.

SEM system 500 may also include an image generator (not shown) arranged to receive the detected signal and generate and/or store an image. The image generator is operable to generate an image based on the detected signal. Thus, SEM system 500 may also include an analog to digital converter for converting the detected signal into a digital signal. SEM system 500 may also include a computer system for processing the image frame data to generate an image of the sample. For example, successive image frame data may be averaged together to create the image.

SEM system 500 may also include a pattern generator (not shown) arranged to generate specific geometrical etch patterns depending on substrate geometries or an operator's intent to etch a particular geometry.

Although the invention has been described as being implemented on SEM system 500 of FIG. 5, of course, another SEM system may be implemented. By way of example, the source may expel electrons at an eV that is substantially equal to the final landing energy value, and the electrons are then accelerated through a series of lens that are set at large positive potentials. As the electrons are expelled from the series of lens, the electrons then slow down and hit the sample at the final landing energy. The series of lenses may throw out a large extraction field out of the objective lens, which acts to decelerate the electron beam, while accelerating the secondary electrons that are emitted from the sample.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

I claim:

1. A method of etching a semiconductor sample comprising:

introducing a reactive agent over a target area of the semiconductor sample;

directing a charged particle beam at the target area such that the charged particle beam impinges the target area and breaks the reactive agent into reactive elements that etch the target area;

monitoring the semiconductor sample for the level of emissions of at least one of secondary electrons and backscatter electrons; and terminating the etching of the target area when at least one of or a weighted combination of the secondary electron and backscatter electron level of emissions changes by a certain amount.

2. A method as recited in claim 1 further comprising:

monitoring the semiconductor sample for the level of emissions of x-rays.

3. A method as recited in claim 2 wherein the level of emissions of x-rays is also used to determine when to terminate the etching of the target area.

4. A method as recited in claim 1 further comprising:

monitoring the amount of current that is proximately within the target area of the semiconductor sample.

5. A method as recited in claim 4 wherein the amount of current within the target area is also used to determine when to terminate the etching of the target area.

6. A method as recited in claim 3 further comprising:

monitoring the amount of current that is proximately within the target area of the semiconductor sample.

7. A method as recited in claim 6 wherein the amount of current within the target area is also used to determine when to terminate the etching of the target area.

8. A method as recited in claim 1 further comprising:

monitoring the composition of gases that emanate from the sample as a result of the target area being etched.

9. A method as recited in claim 8 wherein the composition of gases is also used to determine when to terminate the etching of the target area.

10. A method as recited in claim 1 wherein the charged particle beam is a focused ion-beam.

11. A method as recited in claim 1 further comprising:
monitoring the current level of the charged particle beam; and
adjusting the monitored level of emissions from the semiconductor sample according to the current level of the charged particle beam such that normalized levels of emissions are determined.

12. A method as recited in claim 11 wherein terminating of the etching is based upon the normalized levels of emissions.

13. A method of etching a sample comprising:
scanning a target area on a sample with a charged particle beam such that secondary electrons and backscatter electrons emanate from the target area on the sample;
measuring the level of secondary and backscatter electrons that emit from the target area on the sample;
evaluating a first monitor value by adding together the products of the level of secondary electrons multiplied by a first weighting factor and the level of backscatter electrons multiplied by a second weighting factor;
introducing a reactive substance at the target area wherein the reactive substance reacts with the charged particle beam to break into reactive elements that etch at least a portion of the target area;
monitoring the level of secondary electrons and the level of backscatter electrons while etching the target area;
evaluating a second monitor value at regular time intervals during the process of etching the target area;
determining an endpoint for the etching when a difference between the first monitor value and the second monitor value is approximately greater than a predetermined percentage of the first monitor value; and
terminating the etch of the target area when the endpoint has been reached.

14. A method as recited in claim 13 further comprising:
measuring the current level within the target area of the sample; and
monitoring the current level within the target area while etching the material within the target area.

15. A method as recited in claim 14 wherein the evaluating of the first and second monitor values further includes adding the product of the current level within the target area by a third weighting factor.

16. A method of etching a sample as recited in claim 15 wherein the target area has a first conductive layer that lies on top of a second conductive layer, the method further comprising:
setting the third weighting factor equal to zero.

17. A method as recited in claim 13 further comprising:
measuring the x-ray counts for the x-rays that emit from the target area; and
monitoring the x-ray counts while etching the material within the target area.

18. A method as recited in claim 17 wherein the evaluating of the first and second monitor values further includes adding the product of the x-ray counts by a fourth weighting factor.

19. A method as recited in claim 18 further comprising:
measuring the current level within the target area of the sample; and
monitoring the current level within the target area while etching the material within the target area.

20. A method as recited in claim 13 further comprising:
measuring a composition value of residual gas that emanates from the target area as a result of the target area being etched; and
monitoring the composition value while etching the material within the target area.

21. A method as recited in claim 20 wherein the evaluating of the first and second monitor values further includes adding the product of the current level within the target area by a third weighting factor.

22. A method as recited in claim 21 wherein the evaluating of the first and second monitor values further includes adding the product of the composition value by a fifth weighting factor.

23. A method of etching a sample as recited in claim 13 further comprising:
monitoring the current of the charged particle beam; and
adjusting the monitored level of the secondary electrons and backscatter electrons proportionally with respect to the monitored current of the charged particle beam such that normalized secondary and backscatter electron levels are maintained.

24. A method of etching a sample as recited in claim 13 further comprising:
scanning the target area on the sample with a photon beam such that the photon beam interacts with the reactive substance and further facilitates etching of the material within the target area.

25. A method of etching a sample as recited in claim 13 further comprising:
setting one of the first or second weighting factors to zero.

26. A method of etching a sample as recited in claim 13 wherein the endpoint is determined to have been reached when the predetermined percentage of the first monitor value is 50%.

27. A method of etching a sample as recited in claim 13 further comprising:
retuning the charged particle beam for etching purposes after the first monitor value has been evaluated.

28. A method of etching a sample as recited in claim 13 wherein the etching of the target area produces residual components, the method further comprising:
removing the residual components with the use of a vacuum pump.

29. A method of etching a sample as recited in claim 12 wherein the reactive substance is selected from a group consisting of a chlorine based gas, a fluorine based gas, a bromide based gas, a halogen based gas, a halogen-containing gas, and a mixture of halogen-containing gas and other gases.

30. A method of etching a sample as recited in claim 13 wherein the reactive substance is selected from a group consisting of $CCl_4$, $CHCl_3$, $CH_2Cl_2$, $CH_3Cl$.

31. An apparatus for etching a sample, the apparatus comprising:
a reactive agent injector operable to introduce a reactive substance near a target area on the sample;
a charged particle beam generator operable to scan the target area with a charged particle beam, the charged particle beam interacting with the reactive substance such that the reactive substance and the charged particle beam serve to etch a material of the sample located within the scanned target area;

a secondary electron detector configured to detect a level of secondary electron emissions emanating from the sample;

a backscatter electron detector configured to detect a level of backscatter electron emissions emanating from the sample;

a current meter configured to measure a amount of current flowing through the sample; and an endpoint detection module configured to determine an endpoint for the etching of the material of the sample by monitoring the level of secondary and backscatter emissions detected by the secondary electron detector and the backscatter electron detector and the amount of current measured by the current meter.

32. An apparatus for etching a sample as recited in claim 31 wherein the endpoint detection module is further configured to evaluate a monitor value by adding together the products of the level of secondary electrons multiplied by a first weighting factor, the level of backscatter electrons multiplied by a second weighting factor, and the current level multiplied by a third weighting factor, and wherein the endpoint detection module identifies an endpoint for the etching when the value of the monitor value changes by approximately greater than a predetermine percentage of an monitor value.

33. An apparatus for etching a sample as recited in claim 31 further comprising:

monitoring the current of the charged particle beam; and adjusting the detected levels of the secondary electrons and backscatter electrons proportionally with respect to the measured current of the charged particle beam such that normalized secondary and backscatter electron levels are maintained.

34. An apparatus for etching a sample as recited in claim 31 further comprising:

a photon beam operable to scan the target area with a photon beam, the photon beam interacting with the reactive substance and further facilitating etching of the material within the target area.

35. An apparatus for etching a sample as recited in claim 31 wherein the etching of the target area produces residual components, the apparatus further comprising:

a vacuum pump operable for removing the residual components.

* * * * *

UNITED STATES PATENT AND TRADEMARK OFFICE
CERTIFICATE OF CORRECTION

PATENT NO. : 6,843,927 B2
DATED : January 18, 2005
INVENTOR(S) : Mehran Nasser-Ghodsi It is certified that error appears in the above-identified patent and that said Letters Patent is hereby corrected as shown below:

Title page,
Item [75], Inventors, please change "Mehran Naser-Ghodsi" to -- Mehran Nasser-Ghodsi --.

Signed and Sealed this

Thirty-first Day of May, 2005

JON W. DUDAS
*Director of the United States Patent and Trademark Office*